United States Patent [19]
Bond et al.

[11] Patent Number: 5,281,863
[45] Date of Patent: Jan. 25, 1994

[54] PHASE-LOCKED LOOP FREQUENCY-MULTIPLYING PHASE-MATCHING CIRCUIT WITH A SQUARE-WAVE OUTPUT

[75] Inventors: Joseph R. Bond, San Jose, Calif.; Privavadan R. Patel, Chandler, Ariz.

[73] Assignee: Intel Corporation, Santa Clara, Calif.

[21] Appl. No.: 857,746

[22] Filed: Mar. 26, 1992

[51] Int. Cl.⁵ .................... H03L 7/00; H03B 19/00
[52] U.S. Cl. ........................... 307/271; 328/14
[58] Field of Search ............ 328/14, 15, 20, 155; 307/271; 331/1 A

[56] References Cited

U.S. PATENT DOCUMENTS

| | | | |
|---|---|---|---|
| 4,222,013 | 9/1980 | Bowers et al. | 331/1 A |
| 5,028,887 | 7/1991 | Gilmore | 328/14 |
| 5,036,216 | 7/1991 | Hohmann et al. | 331/1 A |
| 5,079,520 | 1/1992 | Rapeli | 331/1 A |

*Primary Examiner*—Jin F. Ng
*Assistant Examiner*—Sinh Tran
*Attorney, Agent, or Firm*—Blakely, Sokoloff, Taylor & Zafman

[57] ABSTRACT

A circuit for generating a square-wave output signal that is a frequency multiple of and substantially in phase with a reference input signal is described. The invention provides a phase-locked loop frequency multiplier circuit with a square-wave output signal that is substantially in phase with the reference input signal.

7 Claims, 4 Drawing Sheets

PHASE-LOCKED LOOP FREQUENCY-MULTIPLYING PHASE-MATCHING CIRCUIT WITH A SQUARE-WAVE OUTPUT

BACKGROUND OF THE INVENTION

1. Field of the Invention

The present invention relates to the field of integrated circuit frequency multiplier circuits that utilize a phase-locked loop (PLL) circuit to generate a fixed multiple of an input frequency.

2. Prior Art

A fixed multiple of an input frequency commonly must be generated in applications such as frequency synthesizers, video signal generation, obtaining a clock frequency, FM detection/demodulation, pulse synchronization, and in numerous other applications. A PLL frequency multiplier circuit is commonly used to generate an output signal having a frequency that is a fixed multiple of the frequency of the input signal. Unfortunately, the output signal of traditional PLL frequency multiplier circuits is not a square-wave, especially when operating at high frequencies. Additionally, there is a phase difference between the output signal and the input signal. These two problems make traditional PLL frequency multiplier circuits undesirable for some applications.

The past approaches in generating a fixed multiple of an input frequency using a PLL frequency multiplier have thus resulted in a non-square-wave output signal with a phase difference between the output signal and the input signal. Therefore, there exists a need for a PLL frequency multiplier that has a square-wave output signal with substantially no phase difference between the output signal and the input signal. The present invention provides a PLL frequency multiplier circuit having a square-wave output signal that is substantially in phase with the input signal.

SUMMARY OF THE INVENTION

A circuit for generating a square-wave output signal that is a frequency multiple of and is substantially in phase with a reference input signal is described. The present invention includes a phase-locked loop means that, in response to the reference signal and a feedback signal, generates a first signal having a frequency that is a multiple of the frequency of the reference signal. The feedback signal is generated by frequency-dividing and phase-delaying the first signal. The phase-locked loop means generates the first signal such that the resulting feedback signal has substantially the same phase and frequency as the reference signal.

The present invention also includes a first frequency-divider means for generating a second signal in response to the first signal. The second signal is a square-wave and is frequency-divided with respect to the first signal.

The present invention further includes a second frequency-divider means for generating the feedback signal in response to the second signal. The feedback signal is frequency-divided with respect to the second signal. The feedback signal also lags in phase with respect to the second signal.

A delay means is also included for generating the output signal in response to the second signal. The output signal lags in phase with respect to the second signal by substantially the same amount that the feedback signal lags in phase with respect to the second signal such that the output signal, the feedback signal and the reference signal are substantially in phase. In addition, the output signal is a square-wave

DETAILED DESCRIPTION OF THE PREFERRED EMBODIMENT

A PLL frequency multiplier circuit with a square-wave output signal that is in phase with the reference input signal is described. The PLL frequency multiplier circuit of the currently preferred embodiment of the present invention is especially useful for generating clocks that are frequency multiples of and in phase with a global phase clock on an integrated circuit chip. In the following description, numerous specific details are set forth, such as frequencies and phase differences, etc., in order to provide a thorough understanding of the present invention. It will be obvious, however, to one skilled in the art that the present invention may be practiced without these specific details. In other instances, well-known circuits, methods, and the like have not been described in detail in order not to unnecessarily obscure the present invention.

Figure 3:
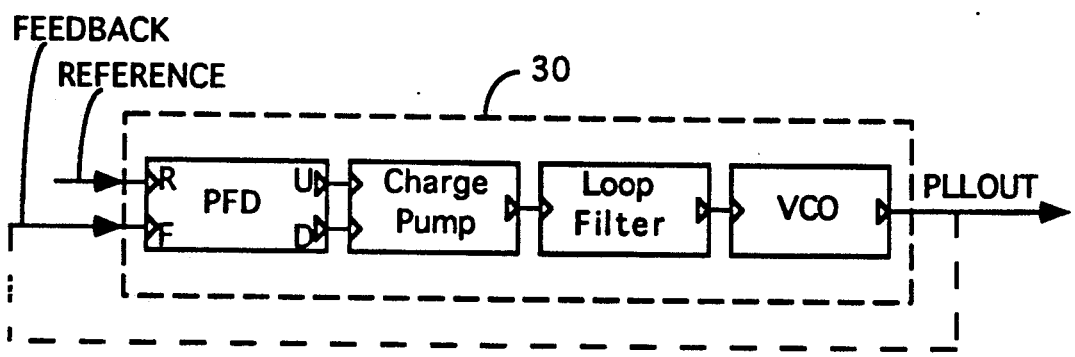
FIG. 3 is a block diagram of a charge-pump phase-locked loop.

A PLL has a reference input signal, a feedback input signal, and an output signal. The feedback input signal is generated from the output signal. The action of the PLL is to adjust the output signal such that the resulting feedback input signal has substantially the same phase and frequency as the reference input signal. The currently preferred embodiment of the present invention uses a charge-pump PLL. As shown in FIG. 3, a charge-pump PLL uses a phase-frequency detector (PFD) to detect differences in phase and frequency between the reference and the feedback inputs. Depending on the relationship detected between the reference input and the feedback input, the PFD causes a charge-pump to either charge or discharge the input to a loop filter. The loop filter filters the output of the charge-pump and drives a voltage controlled oscillator (VCO). The VCO generates an output signal whose frequency is proportional to the voltage at the VCO input. The output signal generated by the VCO is not usually a square-wave, especially at high frequencies. This VCO output signal is used to generate the feedback signal which is an input to the PFD.

FIG. IA is a block diagram of a typical prior art PLL frequency multiplier circuit. PLL 10 receives reference 12 and feedback 14 and generates clock 16. Frequency-divider 18 receives clock 16 and generates feedback 14 which is frequency-divided and phase-delayed with respect to clock 16. PLL 10 adjusts clock 16 such that resulting feedback 14 has substantially the same phase and frequency as reference 12 input signal. Clock 16 is usually not a square-wave, especially when PLL 10 is operating at high frequencies. At lower frequencies the duty cycle of clock 16 is usually not 50% even though clock 16 may resemble a square wave; at higher frequencies clock 16 becomes a distorted sinusoid. The phase delay between clock 16 and feedback 14 introduced by frequency-divider 18 causes a phase difference between clock 16 and reference 12 input signal. Because of the phase difference between clock 16 and reference 12 and the fact that clock 16 i usually not a square-wave, prior art PLLs are unsuitable for generating high-frequency, synchronized clocks for high-speed digital circuits.

Figure 1A:
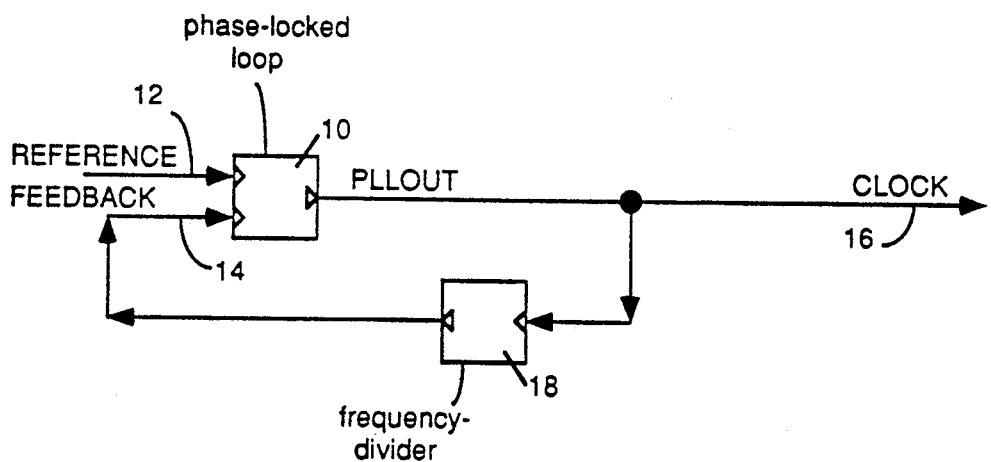
FIG. 1A is a block diagram of a typical prior art frequency multiplying circuit.
Figure 1B:
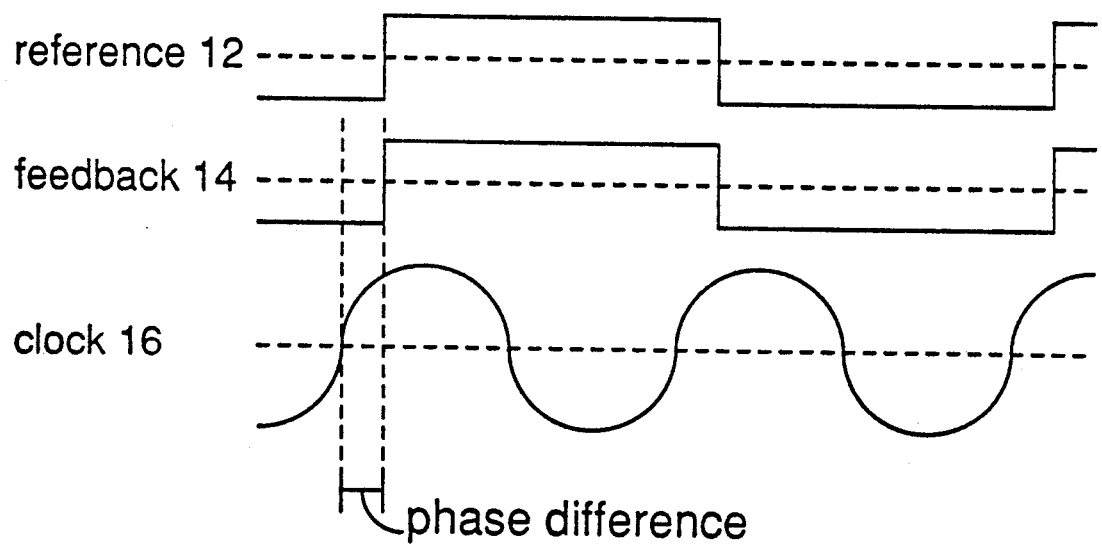
FIG. 1B shows voltage waveforms for the circuit of FIG. 1A specific to the case where frequency-divider 18 of FIG. 1A is a rising-edge, divide-by-two frequency-divider.

FIG. 1B shows waveforms for the prior art circuit of FIG. 1A specific to the case of frequency-divider 18 of FIG. 1A being a rising-edge, divide-by-two frequency-divider. Reference 12 is a fixed frequency signal. PLL 10 generates clock 16 such that resulting input signal feedback 14 has substantially the same phase and frequency as input signal reference 12. Output signal clock 16 is twice the frequency of reference 12 and advanced in phase with respect to reference 12. Because frequency-divider 18 is a divide-by-two frequency divider clock 16 is twice the frequency of reference 12. The phase delay of frequency-divider 18 in receiving clock 16 and generating feedback 14 causes the phase difference between clock 16 and reference 12.

One application where prior art PLL frequency multiplier circuits' drawbacks prevent their use is for generating a higher frequency clock for high-speed digital circuits such as those found on modern VLSI semiconductor microprocessor chips. On a typical microprocessor chip at least one global phase clock is used to control the timing of events among the electronic circuits on the chip. In such a scheme events are triggered on the rising and falling edges of the phase clock. To provide greater flexibility in controlling event timings on a microprocessor chip, a higher frequency secondary clock can be logically combined with the phase clock to trigger events on the additional edges provided by the secondary clock. A PLL frequency multiplier circuit can be used with the phase clock as the input signal to generate the higher frequency secondary clock. To allow the events controlled with the secondary clock to be synchronized with the events controlled by the phase clock, it is critical that there be substantially no phase difference between the phase clock and the secondary clock. Also, square-wave clocks are used on microprocessor chips to allow precise control of event timings. Therefore, prior art PLL frequency multiplier circuits are inadequate for generating higher frequency clocks for high speed digital circuits because the output signal is not a square-wave and there is a phase difference between the input signal and the output signal.

In contrast to the prior art circuit of FIG. 1A, the present invention provides a PLL frequency multiplier circuit having a square-wave output signal that is substantially in phase with the input signal making the circuit suitable for use in generating high-frequency, synchronized clocks for digital circuits.

Figure 2A:
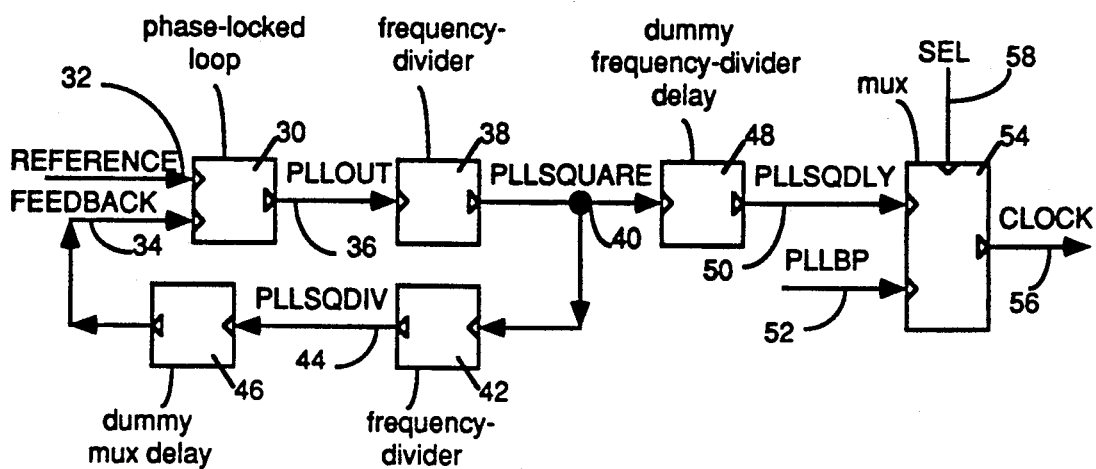
FIG. 2A is a block diagram of the currently preferred embodiment of the present invention.

FIG. 2A shows a block diagram of the currently preferred embodiment of the present invention. The PLL frequency multiplier circuit of FIG. 2A is readily realized as an integrated circuit using well-known complimentary metal-oxide semiconductor (CMOS) processing. PLL 30, frequency-dividers 38 and 42, and mux 54 circuits are well-known circuits. PLL 30 receives reference 32 and feedback 34 and generates pllout 36 which is not usually a square-wave. Frequency-divider 38 receives pllout 36 and generates pllsquare 40 which is a square-wave that is frequency-divided and phase-delayed with respect to pllout 36. Frequency-divider 42 receives pllsquare 40 and generates pllsqdiv 44 which is a square-wave that is frequency-divided and phase-delayed with respect to pllsquare 40. Dummy mux delay 46 receives pllsqdiv 44 and generates feedback 34 which is a square-wave that is the same frequency as pllsqdiv 44 but is phase-delayed with respect to pllsqdiv 44. Dummy frequency-divider delay 48 receives pllsquare 40 and generates pllsqdly 50 which is a square-wave that is the same frequency as pllsquare 40 but is phase-delayed with respect to pllsquare 40 by substantially the same amount that pllsqdiv 44 is phase-delayed with respect to pllsquare 40 such that pllsqdly 50 and pllsqdiv 44 are square-waves that are substantially in phase. Mux 54 receives pllsqdly 50 and pllbp 52 and in response to sel 58 selects either pllsqdly 50 or pllbp 52 to generate output signal clock 56. When sel 58 selects pllsqdly 50, clock 56 is the same frequency as pllsqdly 50 but is phase-delayed with respect to pllsqdly 50 by substantially the same amount that feedback 34 is phase-delayed with respect to pllsqdiv 44 such that clock 56 is a square-wave that is substantially in phase with feedback 34. PLL 30 adjusts pllout 36 output signal such that resulting feedback 34 signal has substantially the same phase and frequency as reference 32 input signal. Therefore, clock 56 is a square-wave signal that is a frequency multiple of reference 32 and is substantially in phase with reference 32.

Figure 4A:
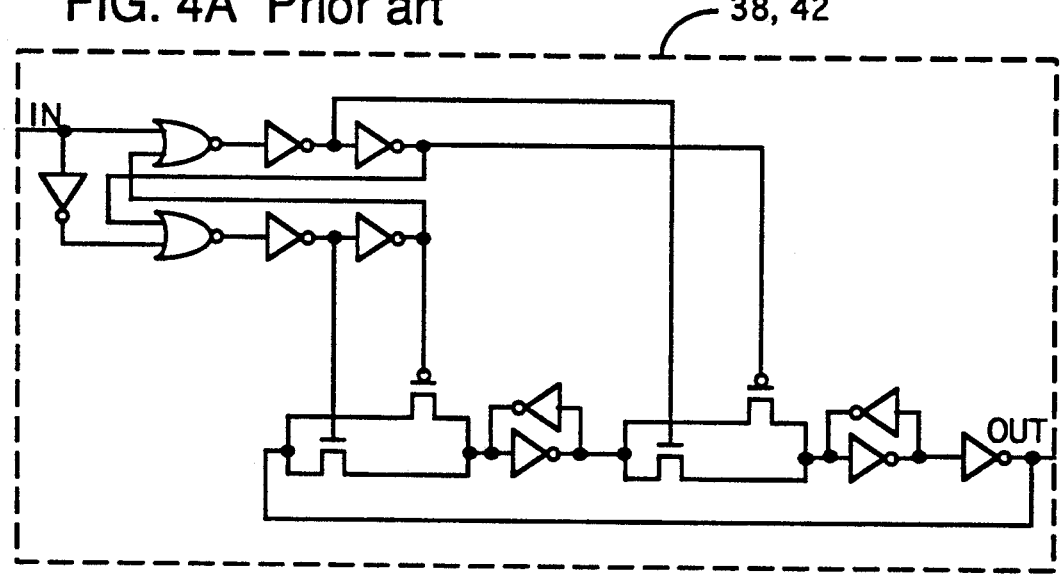
FIG. 4A is a D flip-flop connected as a rising-edge divide-by-two frequency divider circuit.
Figure 4B:
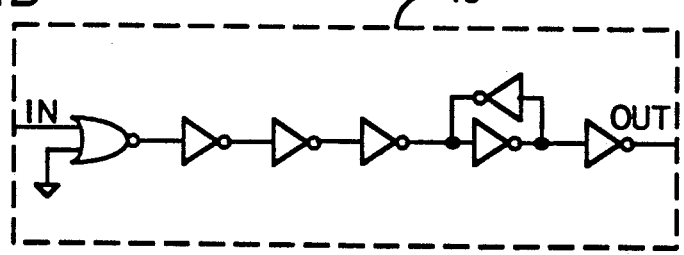
FIG. 4B is a delay circuit that matches the phase delay of the frequency divider circuit of FIG. 4A.
Figure 5A:
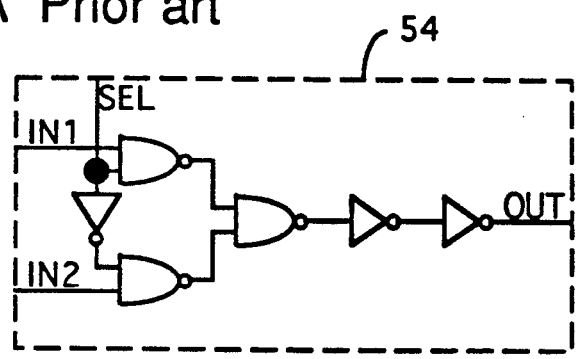
FIG. 5A is a multiplexor circuit.
Figure 5B:
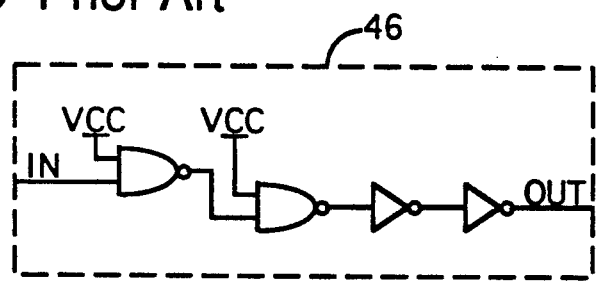
FIG. 5B is a delay circuit that matches the phase delay of the multiplexor circuit of FIG. 5A.

In the currently preferred embodiment of FIG. 2A, frequency-dividers 42 and 38 may be implemented with well-known frequency divider circuits. FIG. 4A, for example, is a D flip-flop rising-edge divide-by-two frequency-divider circuit implemented by connecting the Q# output to the D input. This results in the frequency of the Q output of the D flip-flop being divided-by-two with respect t the frequency of the clock input to the D flip-flop. Mux 54 is a 2:1 mux circuit which is also well-known in the art. FIG. 4B is the dummy frequency-divider delay 48 circuit used in the preferred embodiment of the present invention. FIG. 5B is the dummy mux delay 46 circuit used in the preferred embodiment of the present invention. Dummy frequency-divider delay 48 and dummy mux delay 46 circuits use substantially the same logic as the frequency-divider 42 and mux 54 circuits, respectively, but couple the inputs to remove the dividing or muxing functionality. Therefore, dummy frequency-divider delay 48 and dummy mux delay 46 circuits match the phase delay of frequency-divider 42 and mux 54 circuits, respectively, without frequency-dividing or muxing the input signals. FIG. 5A is the 2:1 mux circuit used in the preferred embodiment of the present invention.

Figure 2B:
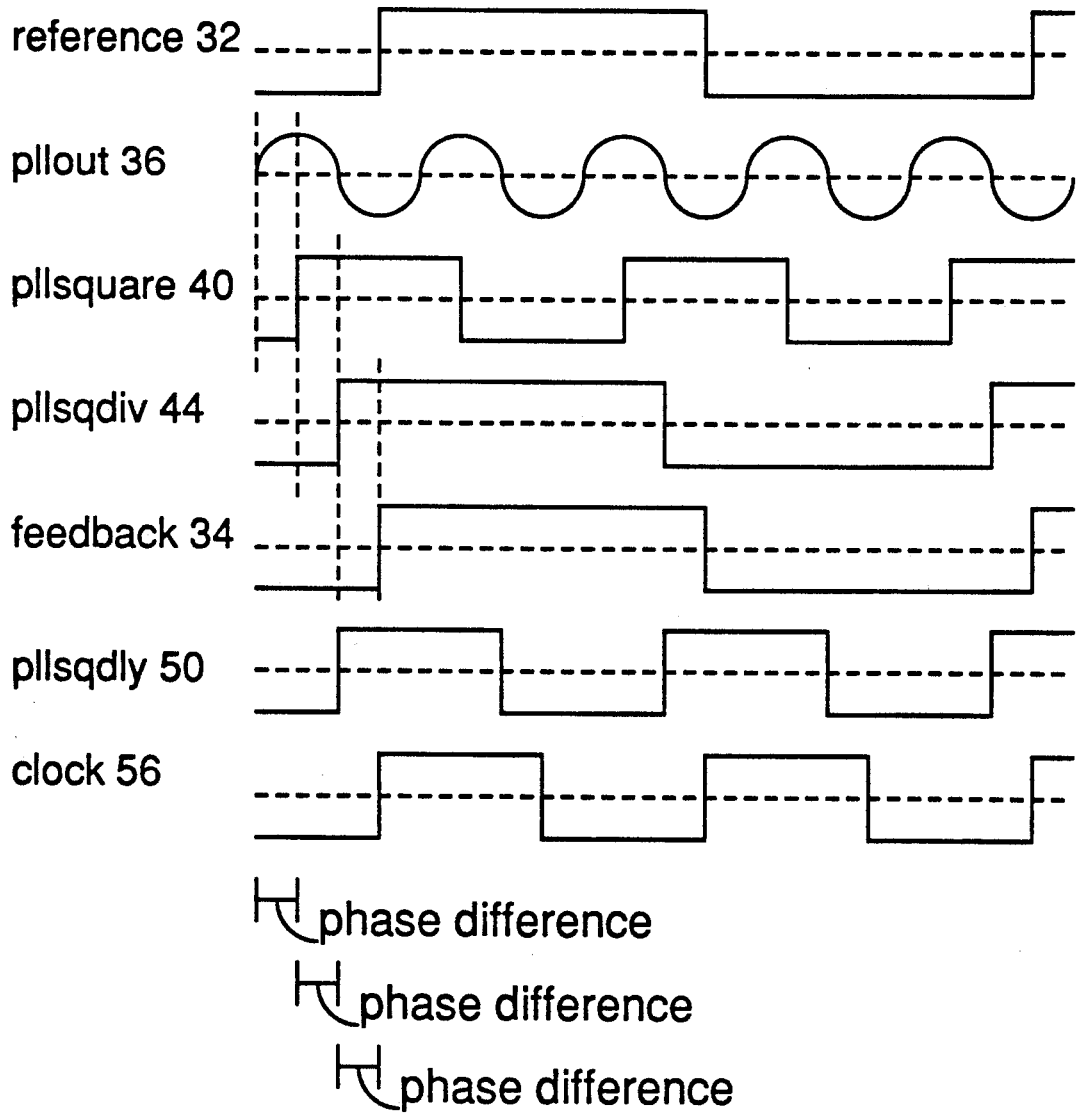
FIG. 2B shows voltage waveforms for the circuit of FIG. 2A specific to the case where frequency-dividers 38 and 42 of FIG. 2A are rising-edge, divide-by-two frequency-dividers.

FIG. 2B shows waveforms for the circuit of FIG. 2A specific to the case of frequency-dividers 42 and 48 of FIG. 2A being rising-edge, divide-by-two frequency-dividers. PLL 30 generates pllout 36 such that resulting feedback 34 has substantially the same phase and frequency as reference 32. Therefore, the starting point for determining the phase and frequency relationship between reference 32 and clock 56 is feedback 34. Pllsqdiv 44 is a square-wave that is the same frequency as feedback 34, but is advanced in phase with respect to feedback 34 by the amount of phase delay caused by dummy mux delay 46. Pllsquare 40 is a square-wave that is twice the frequency of pllsqdiv 44 and advanced in phase with respect to pllsqdiv 44 by the amount of phase delay caused by frequency-divider 42. Pllsqdly 50 is a square-wave that is the same frequency as pllsquare 40, but is delayed in phase with respect to pllsquare 40 by the amount of phase delay caused by dummy frequency-divider delay 48. The phase delay caused by dummy frequency-divider delay 48 is substantially the same a the delay caused by frequency-divider 42 such that pllsqdly 50 and pllsqdiv 44 are square-waves that are substantially in phase. However, pllsqdly 50 is twice the frequency of pllsqdiv 44. When sel 58 selects pllsqdly 50 as the mux input to generate clock 56, clock 56 is a square-wave that is the same frequency as pllsqdly 50, but is delayed in phase with respect to pllsqdly 50 by the amount of phase delay caused by mux 54. The phase delay caused by dummy mux delay 46 is substantially the same as the delay caused by mux 58 such that such that clock 56 and feedback 34 are square-waves that are substantially in phase when sel 58 selects pllsqdly 50. PLL 30 causes feedback 34 and reference 32 to have substantially the same phase and frequency. Therefore, clock 56 is a square-wave signal that is a twice the frequency of reference 32 and also substantially in phase with reference 32.

Another embodiment of the present invention removes mux 54 and dummy mux delay 46 from the PLL frequency multiplier circuit of FIG. 2A. The PLL bypass feature provided by mux 54 is not needed in some applications. In this embodiment pllsqdiv 44 becomes feedback 34 and pllsqdly 50 becomes clock 56. Since pllsqdly 50 which becomes feedback 34 and pllsqdiv 44 which becomes clock 56 substantially match in phase, clock 56 is a square-wave frequency multiple of reference 32 that is substantially in phase with reference 32 in this embodiment.

Yet another embodiment of the present invention generates a frequency multiple of the reference signal that is in phase with the reference signal, but not necessarily a square-wave. Mux 54, dummy mux delay 46, and frequency-divider 38 are removed from the circuit of FIG. 2A in this embodiment. In this embodiment pllsqdiv 44 becomes feedback 34 and pllsqdly 50 becomes clock 56. Since pllsqdly 50 which becomes feedback 34 and pllsqdiv 44 which becomes 56 substantially match in phase, clock 56 will be a frequency multiple of reference 32 that is substantially in phase with reference 32 in this embodiment.

Thus, a PLL frequency multiplier circuit with a square-wave output signal that is substantially in phase with the reference input signal has been described.

What is claimed is:

1. An integrated circuit for generating an output signal that is a frequency multiple of the frequency of a reference input signal and has substantially the same phase a said reference input signal comprising:

phase-locked loop means for receiving said reference input signal and a feedback signal and generating a first signal, said first signal having a frequency that is a multiple of the frequency of said reference input signal, said feedback signal being generated by frequency-dividing and phase-delaying said first signal, said phase-locked loop means generating said first signal such that said feedback signal has substantially the same phase and frequency as said reference signal; .

frequency-divider means for receiving said first signal and generating said feedback signal, said feedback signal being frequency-divided with respect to said first signal, said feedback signal lagging in phase with respect to said first signal; and delay means for receiving said first signal and generating said output signal, said output signal having a frequency that is a multiple of the frequency of said reference signal, said output signal lagging in phase with respect to said first signal by substantially the same amount that said feedback signal lags in phase with respect to said first signal such that said output signal and said feedback signal are substantially in phase, said output signal and said reference signal also being substantially in phase.

2. The circuit of claim 1 wherein said phase-locked loop means is a charge-pump phase-locked loop and said frequency-divider means is a rising-edge divide-by-two frequency divider.

3. An integrated circuit for generating an output signal that is a frequency multiple of the frequency of a reference input signal and has substantially the same phase as said reference input signal comprising:

phase-locked loop means for receiving said reference input signal and a feedback signal and generating a first signal, said first signal having a frequency that is a multiple of the frequency of said reference input signal, said phase-locked loop means generating said first signal such that said feedback signal has substantially the same phase and frequency as said reference input signal;

first frequency-divider means for receiving said first signal and generating a second signal, said second signal being frequency-divided with respect to said first signal, said second signal being a square-wave;

second frequency-divider means for receiving said second signal and generating said feedback signal, said feedback signal being frequency-divided with respect to said second signal, said feedback signal lagging in phase with respect to said second signal; and delay means for receiving said second signal and generating said output signal, said output signal having a frequency that is a multiple of the frequency of said reference input signal, said output signal lagging in phase with respect to said second signal by substantially the same amount that said feedback signal lags in phase with respect to said second signal such that said output signal and said feedback signal are substantially in phase, said output signal and said reference input signal also being substantially in phase, said output signal being a square wave.

4. The circuit of claim 3 wherein said phase-locked loop means is a charge-pump phase-locked loop and said first and second frequency divider means are rising-edge divide-by-two frequency dividers such that the frequency of said output signal is twice the frequency of said reference input signal.

5. An integrated circuit for generating an output signal that is frequency multiple of the frequency of a reference input signal and has substantially the same phase as said reference input signal comprising:

phase-locked loop means for receiving aid reference input signal and a feedback signal and generating a first signal, said first signal having a frequency that is a multiple of the frequency of said reference input signal, said phase-locked loop means generating said first signal such that said feedback signal has substantially the same phase and frequency as said reference input signal;

first frequency-divider means for receiving said first signal and generating a second signal, said second signal being frequency-divided with respect to said first signal, said second signal being a square-wave;

second frequency-divider means for receiving said second signal and generating a third signal, said third signal being frequency-divided with respect to said second signal, said third signal lagging in phase with respect to said second signal;

first delay means for receiving said third signal and generating said feedback signal, said feedback signal lagging in phase with respect to said third signal;

second delay means for receiving said second signal and generating a fourth signal, said fourth signal lagging in phase with respect to said second signal by substantially the same amount that said third signal lags in phase with respect to said second signal such that said fourth signal and said third signal are substantially in phase, said fourth signal being a square wave; and mux means for selecting either said fourth signal or a fifth signal as said output signal, wherein when said fourth signal is selected said output signal lags in phase with respect to said fourth signal by substantially the same amount that said feedback signal lags in phase with respect to said third signal such that said output signal, feedback signal and reference input signal are substantially in phase, said output signal being a square-wave when said mux selects said fourth signal, said output signal having a frequency that is a multiple of the frequency of said reference input signal when said mux selects said fourth signal.

6. The circuit of claim 5 wherein said phase-locked loop means is a charge-pump phase-locked loop and said first and second frequency divider means are rising-edge divide-by-two frequency dividers such that the frequency of said output signal is twice the frequency of said reference signal.

7. A method for generating an output signal that is a frequency multiple of the frequency of a reference input signal and has substantially the same phase as said reference input signal comprising the steps of:

receiving said reference input signal and a feedback signal and generating a first signal, said first signal having a frequency that is a multiple of the frequency of said reference input signal, said feedback signal having substantially the same phase and frequency as said reference input signal;

receiving said first signal and generating a second signal, said second signal being frequency-divided with respect to said first signal, said second signal being a square-wave;

first receiving said second signal and generating a third signal, said third signal being frequency-divided with respect to said second signal, said third signal lagging in phase with respect to said second signal;

receiving said third signal and generating said feedback signal, said feedback signal lagging in phase with respect to said third signal;

second receiving said second signal and generating a fourth signal, said fourth signal lagging in phase with respect to said second signal by substantially the same amount that said third signal lags in phase with respect to said second signal such that said fourth signal and said third signal are substantially in phase, said fourth signal being a square wave; and selecting either said fourth signal or a fifth signal as said output signal, wherein when said fourth signal is selected, said output signal lags in phase with respect to said fourth signal by substantially the same amount that said feedback signal lags in phase with respect to said third signal such that said output signal, feedback signal and reference input signal are substantially in phase, said output signal being a square-wave and said output signal having a frequency that is a multiple of the frequency of said reference input signal.

* * * * *

UNITED STATES PATENT AND TRADEMARK OFFICE
CERTIFICATE OF CORRECTION

PATENT NO. : 5,281,863
DATED : January 25, 1994
INVENTOR(S) : Joseph R. Bond, et al It is certified that error appears in the above-indentified patent and that said Letters Patent is hereby corrected as shown below:

Title page:

[75] Inventor: Delete: "Privavadan R. Patel"
Insert --Priyavadan R. Patel--

Column 5, line 63
Claim 1, Line 4     After the word "phase" Delete "a"   Insert --as--
Column 7, line 1
Claim 5, Line 5     Delete "aid"   Insert --said--

Signed and Sealed this

Fifth Day of July, 1994

Attest:

BRUCE LEHMAN

Attesting Officer     Commissioner of Patents and Trademarks